United States Patent
Wayburn et al.

(10) Patent No.: US 7,017,358 B2
(45) Date of Patent: Mar. 28, 2006

(54) APPARATUS AND METHOD FOR CONTROLLING THE TEMPERATURE OF AN ELECTRONIC DEVICE

(75) Inventors: Lewis S. Wayburn, Irmo, SC (US); Ian G. Spearing, Lexington, SC (US); Derek E. Gage, Irmo, SC (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 10/804,838

(22) Filed: Mar. 19, 2004

(65) Prior Publication Data

US 2004/0261439 A1 Dec. 30, 2004

Related U.S. Application Data

(60) Provisional application No. 60/455,774, filed on Mar. 19, 2003.

(51) Int. Cl.
*F25B 1/00* (2006.01)

(52) U.S. Cl. .................. 62/115; 62/125; 62/259.2; 165/80.4; 361/688

(58) Field of Classification Search .............. 165/80.4, 165/80.1, 81–83, 104.33; 361/688; 62/115, 62/125, 126, 259.2
See application file for complete search history.

(56) References Cited

U.S. PATENT DOCUMENTS

| | | | |
|---|---|---|---|
| 3,913,348 A | 10/1975 | Magester | |
| 4,887,435 A | 12/1989 | Anderson, Jr. | |
| 4,981,020 A | 1/1991 | Scuderi | |
| 5,186,017 A | 2/1993 | Hancock et al. | |
| 5,198,752 A * | 3/1993 | Miyata et al. | 324/760 |
| 5,230,224 A | 7/1993 | Ricketts et al. | |
| 5,379,605 A | 1/1995 | Outlaw et al. | |
| 5,392,610 A | 2/1995 | Nelson et al. | |
| 5,778,969 A * | 7/1998 | Kyung et al. | 165/80.1 |
| 6,104,204 A * | 8/2000 | Hayama et al. | 324/760 |
| 6,134,899 A | 10/2000 | Brown et al. | |
| 6,158,229 A | 12/2000 | Aizawa | |
| 6,184,504 B1 * | 2/2001 | Cardella | 219/513 |
| 6,196,008 B1 | 3/2001 | Fujitaka et al. | |
| 6,263,691 B1 | 7/2001 | Ueno et al. | |
| 6,321,542 B1 | 11/2001 | Ueno et al. | |
| 6,334,311 B1 * | 1/2002 | Kim et al. | 62/3.2 |
| 6,338,255 B1 | 1/2002 | Richard et al. | |
| 6,408,637 B1 | 6/2002 | Hanson et al. | |
| 6,424,141 B1 * | 7/2002 | Hollman et al. | 324/158.1 |
| 6,668,570 B1 | 12/2003 | Wall et al. | |
| 2001/0025496 A1 | 10/2001 | Bimboes et al. | |

FOREIGN PATENT DOCUMENTS

WO    WO 02/097342 A1 *  12/2002

\* cited by examiner

*Primary Examiner*—Mohammad M. Ali
(74) *Attorney, Agent, or Firm*—Foley & Lardner LLP (57) ABSTRACT

An apparatus for controlling the temperature of an electronic device under test includes a thermal head. The thermal head defines a flow channel for passage of a refrigerant fluid so as to cause transfer of thermal energy between the electronic device and the thermal head. A refrigeration system is connected in fluid communication with the flow channel of the thermal head to supply refrigerant fluid thereto. An inlet valve and outlet valve are provided to facilitate disconnection of the thermal head from the refrigeration system. The valves are sequentially closed with the refrigeration system continuing to operate during the interim period so as to reclaim the refrigerant fluid. Accordingly, thermal head may be disconnected from refrigeration system and removed.

23 Claims, 7 Drawing Sheets

APPARATUS AND METHOD FOR CONTROLLING THE TEMPERATURE OF AN ELECTRONIC DEVICE

PRIORITY CLAIM

This application claims priority to Provisional Application Ser. No. 60/455,774, filed on Mar. 19, 2003, which is hereby incorporated by reference.

BACKGROUND OF THE INVENTION

The present invention generally relates to temperature control systems for maintaining the temperature of an electronic device at a predetermined temperature such as while the device is being tested.

Testing equipment has been utilized in the electronics industry to test the operation of an electronic device under test (DUT) such as an integrated circuit. Often, the testing equipment will include a thermal head having a temperature controlled surface which is brought into thermal engagement with a top surface of the DUT. The thermal head functions to maintain a predetermined temperature during the testing operation.

With some such testing equipment, the thermal head is configured as an evaporator in a refrigeration system including a compressor and condenser. Refrigerant fluid passes to the thermal head in liquid form, where it is expanded. The resulting temperature drop absorbs thermal energy from the electronic device being tested so as to maintain a predetermined temperature.

At certain times, the thermal head is removed from the remainder of the refrigeration system for maintenance purposes. This causes a loss of refrigerant fluid from the refrigeration system, which must be replaced (or "recharged") before the refrigeration system will be operational again.

Moreover, testing equipment may be limited in the types of devices that can be tested. For example, different testing machines (each having an appropriately configured thermal head) may be required for each type of electronic device. This can lead to increased costs for both testing equipment and maintenance.

Where the refrigeration system is used in an application other than testing, the maintenance of the electronic equipment may lead removal of components of the refrigeration system, which could result in increased costs and complexity. For example, a separate person skilled in refrigeration maintenance (or significant additional training of the person maintaining the electronic components) and equipped with appropriate refrigeration maintenance tools, such as vacuum pump, refrigerant reclaimation system, refrigerant pressure gauges, etc, would be required. Therefore, there exists a need for improved refrigeration system that overcomes the problems associated with the prior art.

SUMMARY OF THE INVENTION

In one aspect, the present invention provides an apparatus for controlling the temperature of an electronic device. The apparatus comprises a thermal head for engaging the electronic device. The thermal head has an inlet and an outlet defining a flow channel therebetween. A refrigeration system defines a flow loop operative to circulate refrigerant fluid through the flow channel of the thermal head so as to cause transfer of thermal energy between the electronic device and the thermal head.

The apparatus further includes a connection mechanism located in the flow loop. The connection mechanism is adapted to allow the thermal head to be detached from the refrigeration system. A first shutoff valve is situated in the flow loop between the refrigeration system and the inlet of the flow channel. A second shutoff valve is situated in the flow loop between the refrigeration system and the outlet of the flow channel.

In some presently preferred embodiments, the apparatus further comprises a vacuum pump in fluid communication with the flow loop. For example, the vacuum pump may be in fluid communication with a branch line tapped into the flow loop at a location between the outlet of the thermal head's flow channel and the second shutoff valve. A third shutoff valve may be located along the branch line between the flow loop and the vacuum pump. Preferably, the shutoff valves may be electronically controlled valves.

The connection mechanism may comprise a first inlet connector located upstream of the thermal head and a second outlet connector located downstream of the thermal head. In some such embodiments, the branch line for the vacuum pump may be tapped into the flow loop at a location between the flow channel outlet and the second outlet connector.

Often, the first shutoff valve may normally function in an advantageous manner as a metering valve that regulates flow of refrigerant fluid into the flow channel inlet. Similarly, the second shutoff valve may normally function as a metering valve that regulates flow of refrigerant fluid flowing from the flow channel outlet of the thermal head.

In exemplary embodiments, the apparatus may further comprise control means operative to conserve automatically the refrigerant fluid before the thermal head is disconnected from the flow loop. For example, the control means may function to close the first shutoff valve prior to closing the second shutoff valve so that the refrigerant fluid will be conserved by interim operation of the refrigeration system.

In another aspect, the present invention provides an apparatus for controlling the temperature of an electronic device. The apparatus comprises a refrigeration system including a compressor and a condenser. The refrigeration system is operative to circulate a refrigerant fluid through a fluid flow loop such that the refrigerant fluid will change between gaseous and liquid states so as to alternately absorb and release thermal energy. A thermal head having a temperature controlled surface is also provided. The thermal head has an inlet and an outlet defining a flow channel therebetween for passage of the refrigerant fluid to thereby function as an evaporator in the refrigeration system.

First and second shutoff valves are-located in the flow loop between the refrigeration system and the thermal head. The first shutoff valve is located upstream of the thermal head and the second shutoff valve is located downstream of the thermal head. The apparatus further includes control means operative to sequentially close the first shutoff valve and the second shutoff valve while continuing to operate the compressor in the interim period of time so as to reclaim the refrigerant fluid.

In a still further aspect, the present invention provides an apparatus comprising a refrigeration system including a compressor and a condenser. The refrigeration system is operative to circulate a refrigerant fluid through a fluid flow loop such that the refrigerant fluid will change between gaseous and liquid states so as to alternately absorb and release thermal energy. A first shutoff valve is located in the fluid flow loop at a position downstream of the condenser. A second shutoff valve is located in the fluid flow loop at a position upstream of the compressor.

The apparatus further includes a first thermal head configured to be detachably connected into the fluid flow loop so as to function as an evaporator in the refrigeration system. The first thermal head has a temperature controlled surface of a first configuration for making thermal contact with a first electronic device. The apparatus also includes a second thermal head configured to be detachably connected into the fluid flow loop so as to function as an evaporator in the refrigeration system. The second thermal head has a temperature controlled surface of a second configuration for making thermal contact with a second electronic device.

Another aspect of the invention involves a method comprising the step of providing a first thermal head for cooling an electronic device, the first thermal head being connected into a fluid flow loop of a refrigeration system. Another step of the method involves providing first and second shutoff valves in the fluid flow loop on upstream and downstream sides of the thermal head, respectively. Another step of the method involves closing the first shutoff valve while operating the refrigeration system to prevent further flow of refrigerant fluid into the first thermal head. As a further step, the refrigeration system continues to operate until substantially all of the refrigerant fluid is drawn from the thermal head. Next, the second shutoff valve is closed with the first shutoff valve remaining closed so as to trap substantially all of the refrigerant fluid. The first thermal head is then disconnected from the refrigeration system.

According to exemplary methodology, a second thermal head may be connected into the fluid flow loop of the refrigeration system. Air within the second thermal head is then evacuated. Next, the first and second shutoff valves are opened to allow normal flow of refrigerant fluid to resume. Preferably, various steps of the method are automatically completed in response to actuation of a user input device.

Other objects, features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only and is not intended as limiting the broader aspects of the present invention, which broader aspects are embodied in the exemplary constructions.

Figure 1:
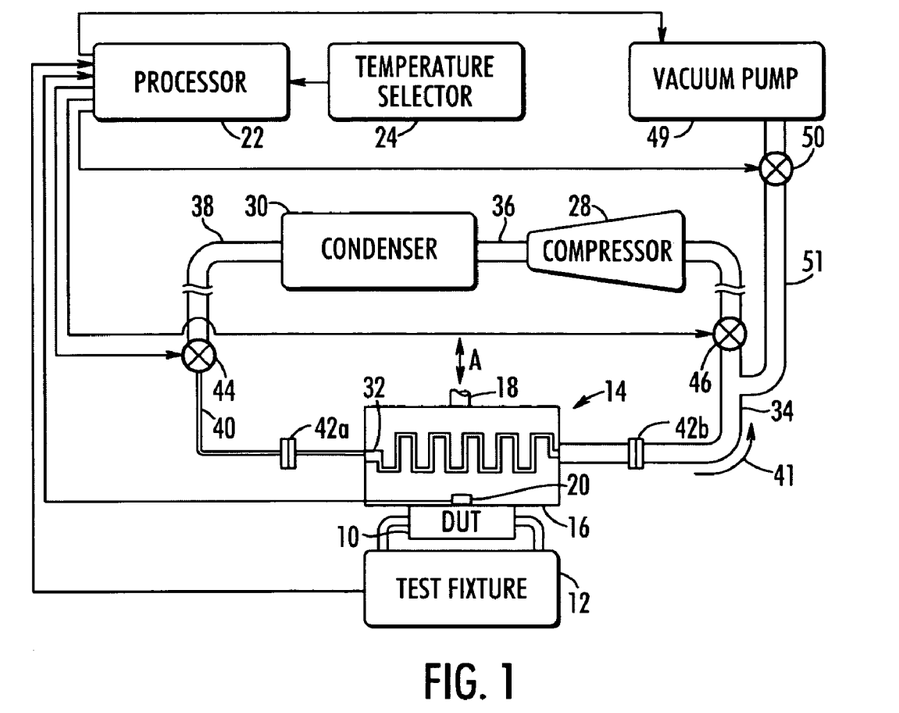
FIG. 1 is a diagrammatic representation of an apparatus constructed in accordance with the present invention for controlling the temperature of an electronic device under test.

FIG. 1 illustrates an apparatus for controlling the temperature of an electronic device 10 under test ("DUT"). Although the invention will be described in conjunction with a DUT, one of ordinary skill in the art should appreciate that the invention could be used to control the temperature of other electronic devices. Moreover, the present invention could be applied to mechanical devices. For example, the temperature of a motor could controlled using the present invention. Further, the present invention could be applied to other components in a refrigeration system, such as filters or dryers and compressors, even though it will be discussed in conjunction with a thermal head below. Further, it should be appreciated that multiple thermal heads could be used in conjunction with the refrigeration system to simultaneously control the temperature of multiple electronic devices.

As shown, device 10 is an integrated circuit device mounted in a suitable test fixture 12. Test fixture 12 supplies the energy to power device 10, as well as the various read/write commands by which the performance of device 10 is evaluated.

A thermal head 14 has a temperature controlled surface 16 in thermal contact with device 10. In this case, thermal head 14 is attached to the end of a movable rod 18 which operates to move temperature controlled surface 16 into and out of engagement with device 10 (as indicated by arrow A). For example, rod 18 may form the piston rod of a pneumatic cylinder which is actuated to position thermal head 14 adjacent the device to be tested.

As shown, a thermocouple 20 or other suitable sensor is provided at temperature controlled surface 16 to detect the temperature of device 10. This information is fed to a processor 22 for controlling the operation of thermal head 14 so as to maintain a predetermined temperature. For example, the temperature to be maintained is entered by a user at temperature selector 24 or may be controlled automatically by the test program. One skilled in the art will recognize that the functions of processor 22 and temperature selector 24 may be performed by a single digital computer or the like.

Thermal head 14 may be configured having both cooling and heating capability to accurately maintain a wide range of possible temperatures. In this regards, thermal head 14 may also include heating elements or the like to supply thermal energy if the temperature of device 10 drops below the selected temperature.

Thermal head 14 forms the evaporator of a refrigeration system also including a compressor 28 and a condenser 30 in this embodiment. It should be appreciated that a pump could be used instead of a compressor as the refrigeration application requires. The refrigeration system employs a suitable refrigerant fluid, such as R134a, circulated so as to alternately absorb and release thermal energy. This occurs when the refrigerant fluid changes between gaseous and liquid states in accordance with the well-known refrigeration cycle.

In particular, the refrigerant fluid absorbs excess thermal energy at the location of device 10 when refrigerant fluid "evaporates" from a liquid state to a gaseous state. This evaporation occurs in a fluid flow channel 32 defined in thermal head 14. The low pressure gas exiting thermal head 14 is then fed along pipe 34 to compressor 28 (the direction of fluid flow is indicated by arrow 41). The resulting high pressure gas is fed to condenser 30 by pipe 36, where accumulated thermal energy dissipates. As a result, the refrigerant fluid is condensed to liquid form.

High pressure liquid from condenser 30 is fed back toward thermal head 14 along pipe 38 and capillary tube 40 (or other expansion device). The apparatus is configured such that expansion occurs in the flow loop prior to thermal head 14 to produce a desired temperature drop. The manner in which refrigerant expansion occurs depends on the particular design.

A suitable connection mechanism, such as connectors 42a and 42b, is provided so that thermal head 14 may be easily disconnected from capillary tube 40 and pipe 34. For example, thermal head 14 could be removed for maintenance or replaced by another thermal head, without requiring significant downtime. If different sizes of devices are to be tested, a set of thermal heads of different sizes could be provided. Depending upon the size of the device to be tested, the appropriate thermal head could be selected and attached. It should be appreciated that numerous couplings that detachably connect a pair of pipes could be used for connectors 42a and 42b.

Figure 2:
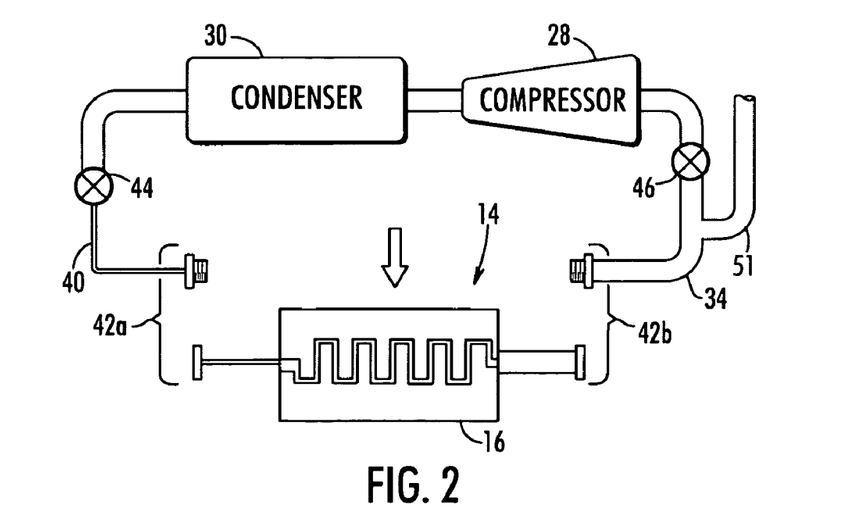
FIG. 2 is a partial diagrammatic representation of the apparatus of FIG. 1, showing detachment of the thermal head.

Referring now also to FIG. 2, an inlet valve 44 and an outlet valve 46 are provided to prevent loss of refrigerant fluid during removal of thermal head 14. Refrigerant fluid within thermal head 14, capillary tube 40 and pipe 34 is reclaimed by sequentially closing inlet valve 44 and outlet valve 46. With inlet valve 44 closed, compressor 28 (or cold condenser in a pumped refrigeration system) continues to operate so as to draw the refrigerant fluid from thermal head 14. The refrigerant fluid becomes trapped (and thus reclaimed) in the area between compressor 28 and valve 44. Once refrigerant fluid has been reclaimed by the refrigeration system, outlet valve 46 may be closed. Connectors 42a and 42b may then be detached and thermal head 14 removed (as shown in FIG. 2).

It should be appreciated that inlet valve 44 and outlet valve 46 may be electronic valves. If electronic valves are used, the opening and closing of valves 44 and 46 could be automated. Moreover, valves 44 and 46 could control the flow of refrigerant fluid within thermal head 14 during normal operation of the refrigeration system. For example, inlet valve 44 and outlet valve 46 could be metering valves, such as normally closed solenoid pulsing valves.

Figure 3:
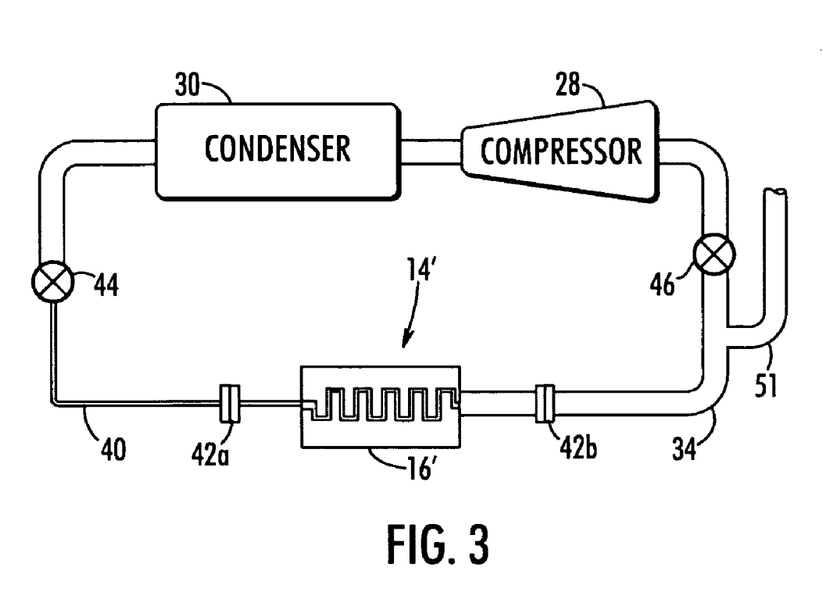
FIG. 3 is a view similar to FIG. 2, but showing attachment of a different thermal head.

Thermal head 14 may then be reattached to refrigeration system 48 using connectors 42a and 42b (or a different thermal head may be attached in place of thermal head 14). As shown in FIG. 3, for example, a different thermal head 14' configured for use with another type of electronic device could be attached. The temperature controlled surface 16' of thermal head 14' could have a different surface area than corresponding surface 16 of thermal head 14.

Referring again to FIG. 1, a vacuum pump 49 is provided to remove air after reattachment of thermal head 14 (or thermal head 14'). After opening valve 50, a vacuum source, such as vacuum pump 49 may be activated to remove air from the portion of the flow channel between inlet valve 44 and outlet valve 46 (containing connectors 42a and 42b). While FIG. 1 shows vacuum pump 49 connected to pipe 34 via branch line 51, it should be appreciated that vacuum pump 49 merely needs to be in fluid communication with thermal head 14, capillary tube 40 and pipe 34. Thus, vacuum pump 49 could be connected anywhere between inlet valve 44 and outlet valve 46. Once air has been removed, inlet valve 44 and outlet valve 46 may be opened to resume normal operation of the refrigeration system.

Figure 4A:
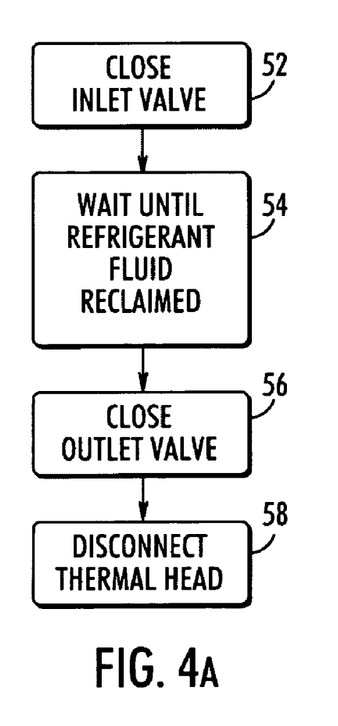
FIG. 4A is a flow diagram showing steps of a preferred process for detaching the thermal head.

Referring to FIG. 4A, the first step (indicated at 52) in removing thermal head 14 is closing inlet valve 44. With inlet valve 44 closed, compressor 28 causes negative pressure within thermal head 14, capillary tube 40 and pipe 34. Thus, refrigeration system 48 reclaims refrigerate fluid (as indicated at 54). Once substantially all refrigerant fluid has been reclaimed, outlet valve 46 may be closed (as indicated at 56) so as to trap the reclaimed refrigerant fluid. Accordingly, thermal head 14 may be removed by detaching connectors 42a–b (as indicated at 58) without losing refrigerant fluid.

Figure 4B:
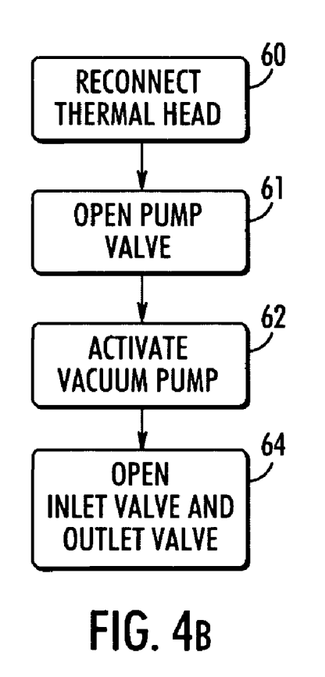
FIG. 4B is a flow diagram showing steps of a preferred process for reconnecting the thermal head.

Referring to FIG. 4B, thermal head 14 (or another thermal head) may be reconnected to the refrigeration system using connectors 42a and 42b (as indicated at 60). In order to remove undesired air, pump valve 50 is opened (as indicated at 61) and vacuum pump 49 is activated (as indicated at 62). Once all air has been removed on this side of the flow loop, inlet valve 44 and outlet valve 46 may be opened (as indicated at 64). As a result, refrigerant fluid will flow into thermal head 14 so that normal operation can resume.

In one embodiment, many steps of the process may be automated. For example, inlet valve 44 and outlet valve 46 may be electronic valves controlled by processor 22. Vacuum pump 49 and valve 50 may also be controlled by processor 22.

The user may start the process by simply actuating a user input device, such as a button. As a result, inlet valve 44 would be automatically closed. Outlet valve 46 would also automatically close, but only after refrigerant fluid had been reclaimed by the refrigeration system. Once valves 44 and 46 are closed, an indicator, such as a light or sound, may be provided to inform the user that thermal head 14 is ready for disconnection and removal. In one embodiment, once valves 44 and 46 are closed, the thermal head may be automatically mechanically released. An indicator may be provided to inform the user that the thermal head has been released.

Once thermal head 14 has been reattached, the user may again simply actuate a user input device (or means could be provided for automatically detecting the correct reattachment of a thermal head). Accordingly, vacuum pump 49 and valve 50 would be actuated under control of processor 22 so as to remove air from the portion of the flow loop between valves 44 and 46 that includes thermal head 14. After a sufficient vacuum had been drawn, inlet valve 44 and outlet valve 46 could then automatically open to allow normal operation. An indicator could be provided to alert the user in this regard.

Figure 5:
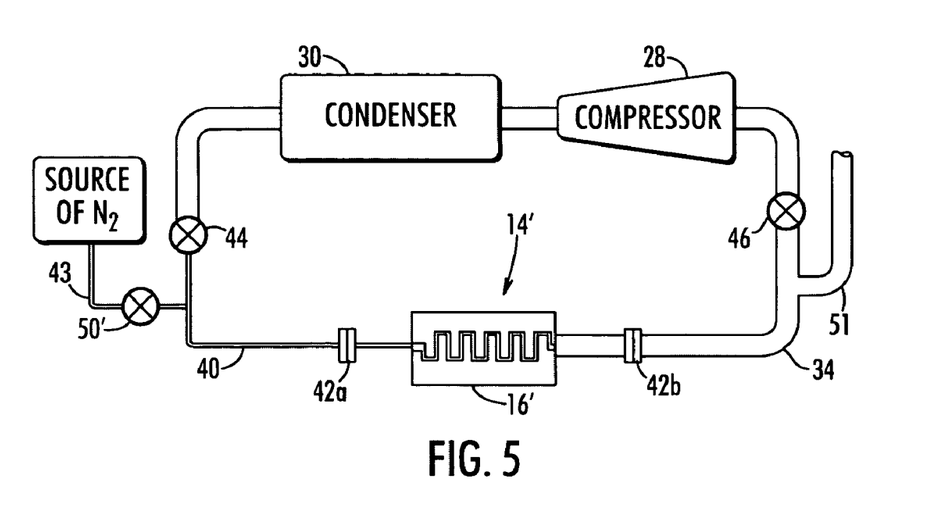
FIG. 5 is a partial diagrammatic representation of an embodiment of the present invention.
Figure 6:
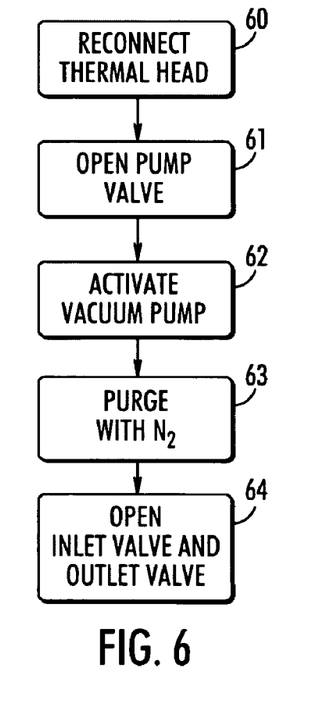
FIG. 6 is a flow diagram showing steps of a process for reconnecting the thermal head utilizing the embodiment of FIG. 5.

Referring to FIGS. 5 and 6, an embodiment is shown in which a source of dry gas, such as dry nitrogen, is provided in fluid communication with capillary tube 40 via pipe 43 to quickly remove moisture within thermal head 14 prior to opening inlet and outlet valves 44 and 46. While FIG. 5 shows the source of gas connected to pipe 43, it should be appreciated that the source of gas merely needs to be in fluid communication with thermal head 14 anywhere between inlet valve 44 and outlet valve 46 (containing connectors 42a and 42b).

After reconnecting thermal head 14 (as indicated at 60 in FIG. 6) and opening of pump valve 50 and 50' (as indicated at 61 in FIG. 6), activation of vacuum pump 49 draws dry gas through capillary tube 40 and pipe 43. It should be appreciated that valve 50' may be opened after valve 50 has been opened or simultaneously with the opening of valve 50. This purges moisture (as indicated at 63 in FIG. 6) within thermal head 14 in a relatively short period of time. In fact, it has been found that purging thermal head 14 with a dry gas dramatically shortens the amount of time for removal of moisture within thermal head 14. In one embodiment, valve 50' may be closed prior to closing of valve 50. Once valve 50 is closed, inlet valve 44 and outlet valve 46 may be opened (as indicated at 64).

In one embodiment, the source of gas and vacuum pump 49 could be portable and directly connected to thermal head 14 using quick connectors for easy removal by a maintenance person. This would allow the source of gas and vacuum pump to be removed after maintenance and then used on other thermal heads 14. Moreover, this would allow also fewer components to be permanently installed in the refrigeration/electronic system. Further, in an embodiment with one or more thermal heads, there would not be a need for a pipe to each thermal head for dry gas and vacuum source nor a need for a valve for each of these pipes.

Figure 7:
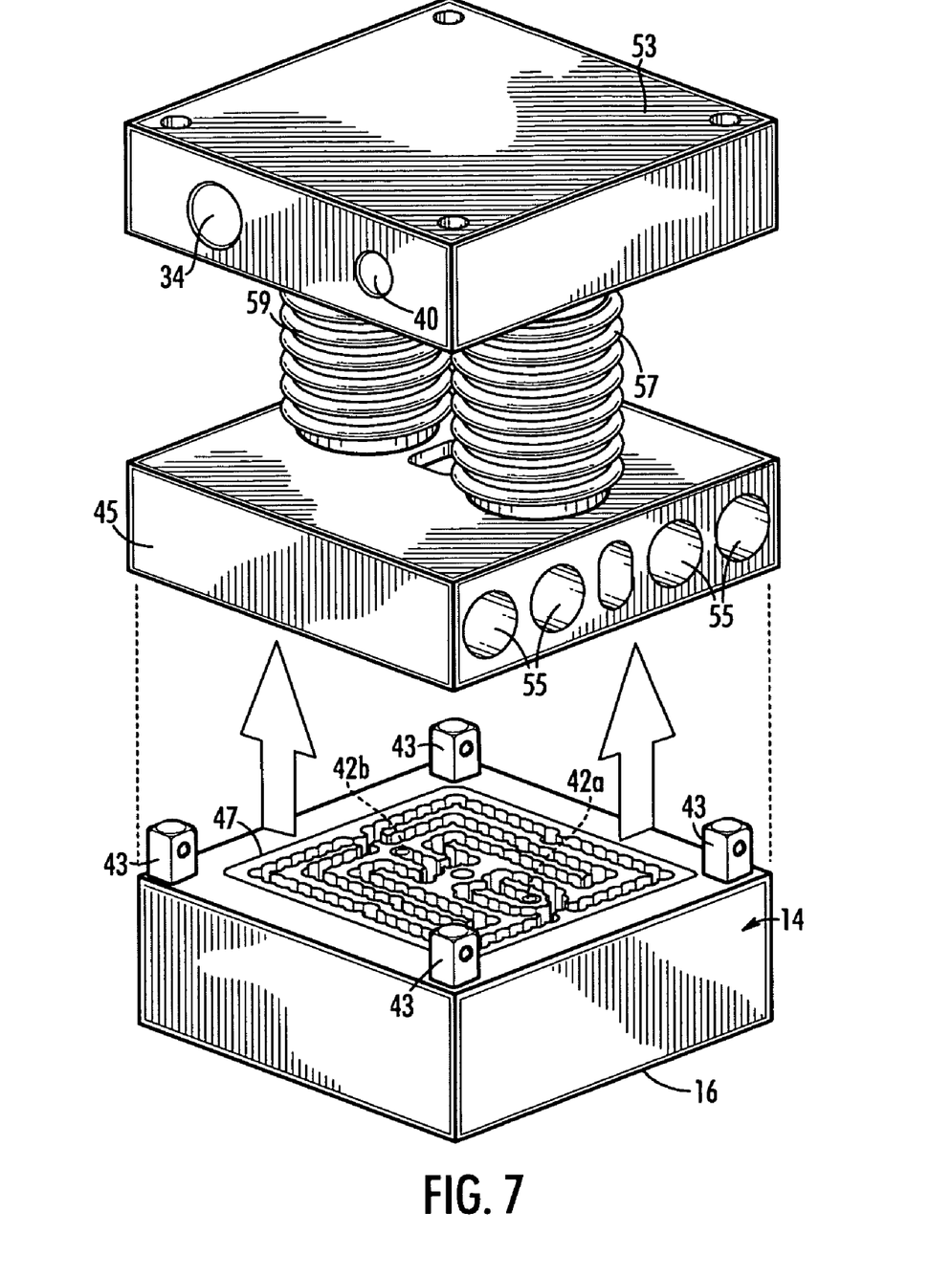
FIG. 7 is a perspective view of a thermal head having the evaporator detached.
Figure 8:
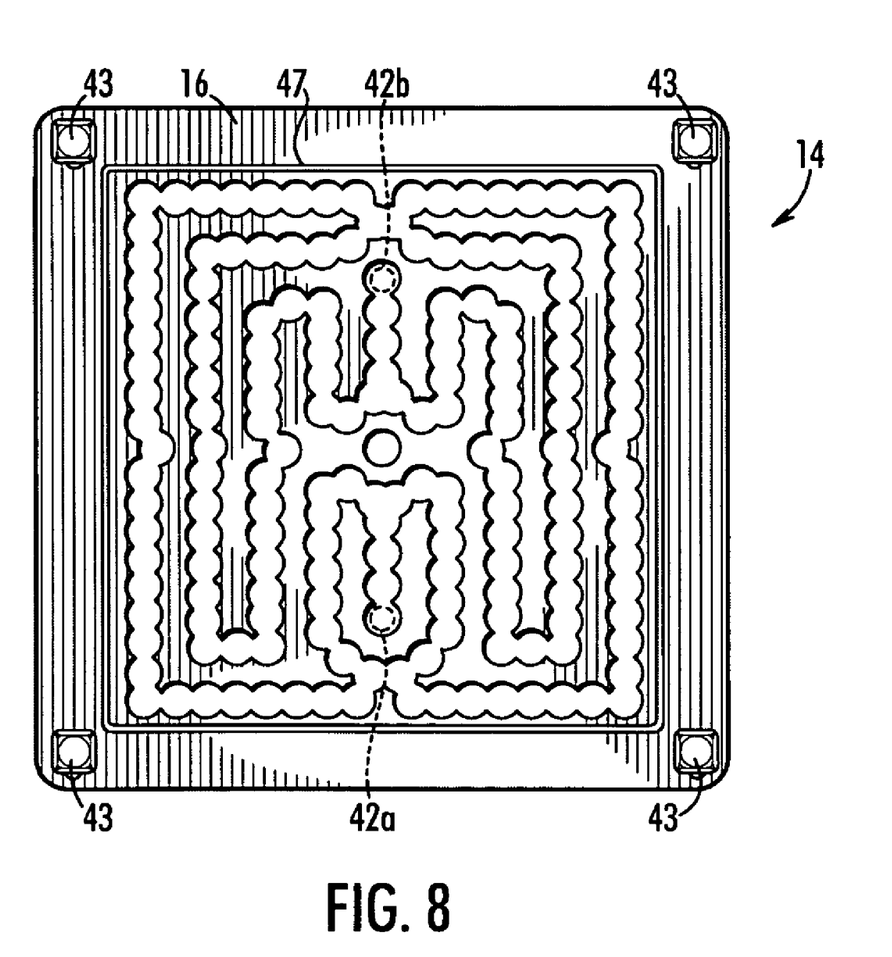
FIG. 8 is a top plan view of the evaporator of FIG. 7.

FIGS. 7 and 8 illustrate an embodiment in which temperature controlled surface 16 is in fluid communication with capillary tube 40 and pipe 34 using detent connectors 43. In the embodiment shown, refrigerant flows from capillary tube 40, enters a manifold 53 and passes through a bellow 57 and heater block 45 to connector 42a. After flowing through the passages formed in evaporator 14, refrigerant exits through connector 42b, passes through heater block 45 and bellow 59 and exits manifold 53 through pipe 34.

Evaporator 16 may be connected directly to a heater block 45 using detent connectors 43. Heater block 45 will often have cavities 55 to hold cartridge heaters (not shown). It should be appreciated that multiple or a single detent connector could be used. Moreover, any suitable mechanical connector(s) could be used for detent connectors 42a and 42b. A gasket 47 may be provided to prevent leakage of refrigerant fluid from evaporator 14.

Figure 9:
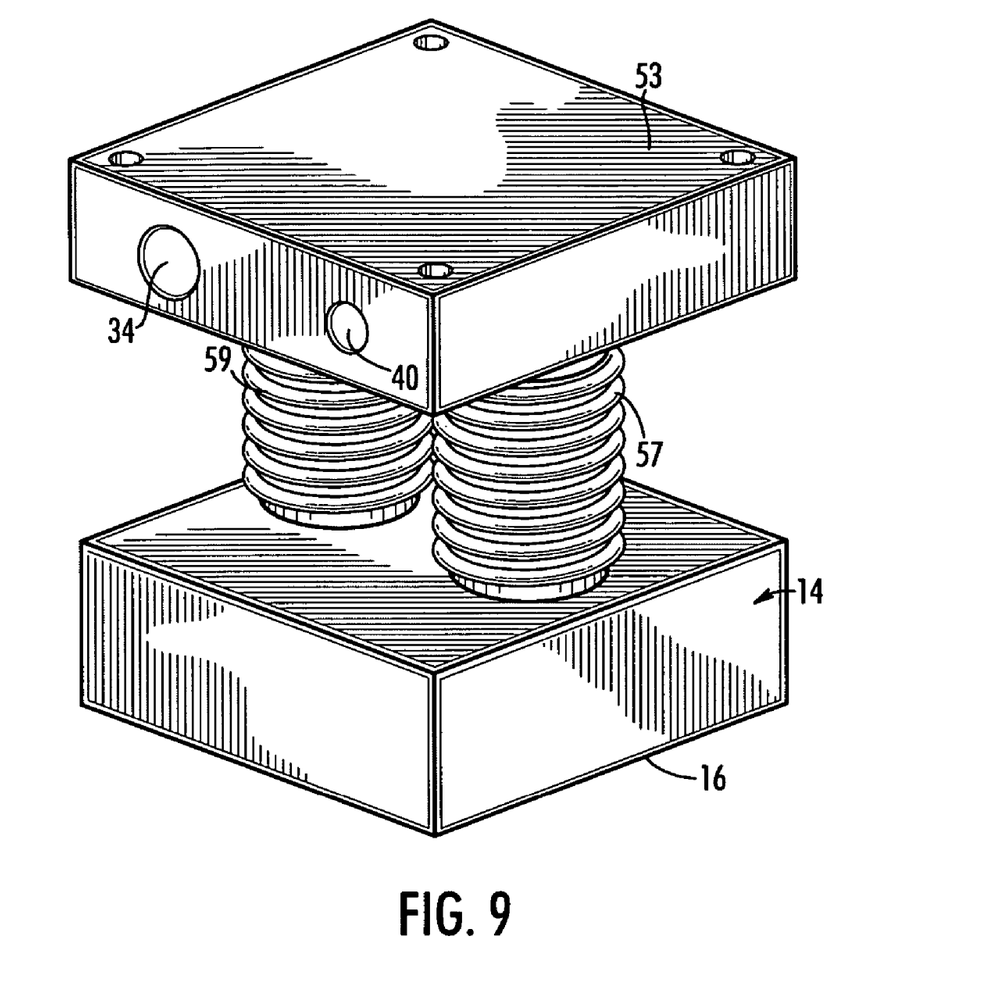
FIG. 9 is a perspective view of a thermal head according to another embodiment of the present invention.
Figure 10:
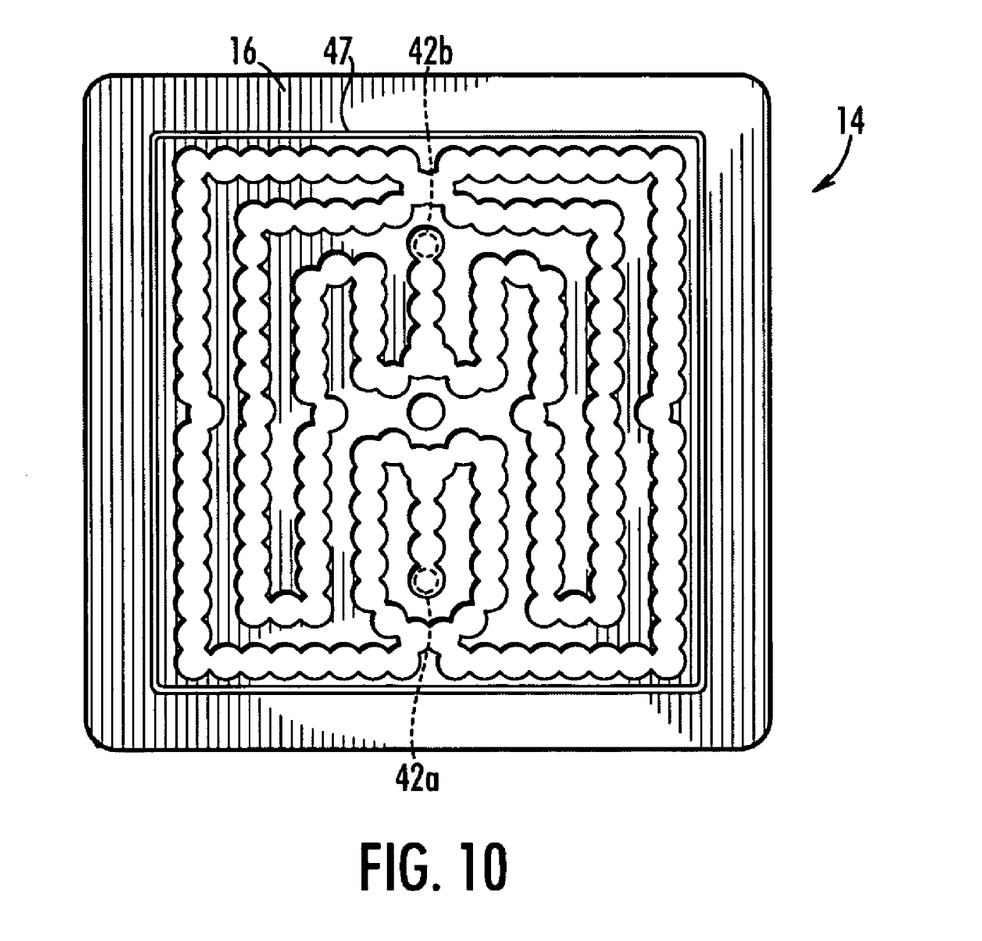
FIG. 10 is a bottom view of the thermal head of FIG. 9.

FIGS. 9 and 10 illustrate an embodiment in which refrigerant flows through open channels formed on the bottom surface of thermal head 14 (as seen in FIG. 10). Refrigerant will only flow through these channels when thermal head 14 has engaged the device under test. With this engagement, the top surface of the device under test seals channels to prevent leakage of refrigerant. In other words, the top surface of the device under test acts as the bottom of thermal head 14 to prevent refrigerant from leaking out of thermal head 14. Thus, refrigerant would contact the top surface of the device under test, thereby increasing the thermal transfer. Moreover, thermal head 14 could be integrally formed in an electronic device, such that the top surface of the electronic device seals refrigerant in thermal head 14. Thus, the electronic device would be included as part of the thermal head 14. It should be appreciated that the top surface of the device could have surface enhancements to improve heat transfer. For example, the channels in thermal head 14 could be formed on the top surface of the electronic device. A gasket 47 may also be provided to prevent leakage.

While preferred embodiments of the invention have been shown and described, modifications and variations may by made thereto by those of skill in the art without departing from the spirit and scope of the present invention. It should also be understood that aspects of various embodiments may be interchangeable in whole or in part. Furthermore, those of ordinary skill in the art will appreciate that the foregoing description is by way of example only, and is not intended to be limitative of the invention so further described in the appended claims.

What is claimed is:

1. An apparatus for controlling the temperature of an electronic device, said apparatus comprising:
    a thermal head for engaging said electronic device;
    said thermal head having an inlet and an outlet defining a flow channel therebetween;
    a refrigeration system defining a flow loop operative to circulate refrigerant fluid through said flow channel of said thermal head so as to cause transfer of thermal energy between said electronic device and said thermal head;
    a connection mechanism located in said flow loop, said connection mechanism adapted to allow said thermal head to be detached from said refrigeration system;
    a first shutoff valve situated in said flow loop between said refrigeration system and said inlet; and
    a second shutoff valve situated in said flow loop between said refrigeration system and said outlet.

2. The apparatus as recited in claim 1, further comprising a vacuum pump in fluid communication with said flow loop.

3. The apparatus as recited in claim 2, wherein said vacuum pump is in fluid communication with a branch line tapped into said flow loop at a location between said outlet of said flow channel and said second shutoff valve.

4. The apparatus as recited in claim 3, further comprising a third shutoff valve located along said branch line between said flow loop and said vacuum pump.

5. The apparatus as recited in claim 4, wherein said shutoff valves are electronically controlled valves.

6. The apparatus as recited in claim 1, wherein said connection mechanism comprises a first inlet connector located upstream of said thermal head and a second outlet connector located downstream of said thermal head.

7. The apparatus as recited it claim 6, further comprising a vacuum pump in fluid communication with a branch line tapped into said flow loop at a location between said outlet of said flow channel and said second outlet connector.

8. The apparatus as recited in claim 1, wherein said first shutoff valve normally functions as a metering valve that regulates flow of said refrigerant fluid into said inlet of said flow channel.

9. The apparatus as recited in claim 8, wherein said second shutoff valve normally functions as a metering valve that regulates flow of said refrigerant fluid flowing from said outlet of said flow channel.

10. The apparatus as recited in claim 1, further comprising control means operative to conserve automatically said refrigerant fluid before said thermal head is disconnected from said flow loop.

11. The apparatus as recited in claim 10, wherein said control means functions to close said first shutoff valve prior to closing said second shutoff valve so that said refrigerant fluid will be conserved by interim operation of said refrigeration system.

12. The apparatus as recited in claim 1, wherein a portion of said flow channel includes open channels formed in said thermal head.

13. An apparatus for controlling the temperature of an electronic device, said apparatus comprising:
    a refrigeration system including a compressor and a condenser, said refrigeration system being operative to circulate a refrigerant fluid through a fluid flow loop such that said refrigerant fluid will change between gaseous and liquid states so as to alternately absorb and release thermal energy;

a thermal head having a temperature controlled surface, said thermal head having an inlet and an outlet defining a flow channel therebetween for passage of said refrigerant fluid to thereby function as an evaporator in said refrigeration system;

first and second shutoff valves located in said flow loop between said refrigeration system and said thermal head, said first shutoff valve being upstream of said thermal head and said second shutoff valve being downstream of said thermal head; and control means operative to sequentially close said first shutoff valve and said second shutoff valve while continuing to operate said compressor in the interim period of time so as to reclaim said refrigerant fluid.

14. The apparatus as recited in claim 13, further comprising a first inlet connector located in said flow loop between said thermal head and said first shutoff valve and a second outlet connector located in said flow loop between said thermal head and said second shutoff valve.

15. The apparatus as recited in claim 14, further comprising a vacuum pump in fluid communication with said flow loop.

16. The apparatus as recited in claim 15, wherein said vacuum pump is in fluid communication with a branch line tapped into said flow loop at a location between said second shutoff valve and said second outlet connector.

17. The apparatus as recited in claim 16, further comprising a third shutoff valve located along said branch line.

18. The apparatus as recited in claim 15, further comprising a source of dry gas in fluid communication with said flow loop.

19. The apparatus as recited in claim 17, wherein said first and second shutoff valves normally function as metering valves to regulate flow of said refrigerant fluid into and out of said thermal head, respectively.

20. An apparatus comprising:

a refrigeration system including a compressor and a condenser, said refrigeration system being operative to circulate a refrigerant fluid through a fluid flow loop such that said refrigerant fluid will change between gaseous and liquid states so as to alternately absorb and release thermal energy;

a first shutoff valve located in said fluid flow loop at a position downstream of said condenser;

a second shutoff valve located in said fluid flow loop at a position upstream of said compressor;

a first thermal head configured to be detachably connected into said fluid flow loop so as to function as an evaporator in said refrigeration system, said first thermal head having a temperature controlled surface of a first configuration for making thermal contact with a first electronic device; and a second thermal head configured to be detachably connected into said fluid flow loop so as to function as an evaporator in said refrigeration system, said second thermal head having a temperature controlled surface of a second configuration for making thermal contact with a second electronic device.

21. A method comprising steps of:

(a) providing a first thermal head for cooling an electronic device, said first thermal head being connected into a fluid flow loop of a refrigeration system;

(b) providing first and second shutoff valves in said fluid flow loop on upstream and downstream sides of said thermal head, respectively;

(c) while operating said refrigeration system, closing said first shutoff valve to prevent further flow of refrigerant fluid into said first thermal head;

(d) continuing to operate said refrigeration system until substantially all of said refrigerant fluid is drawn from said thermal head;

(e) closing said second shutoff valve with said first shutoff valve remaining closed so as to trap substantially all of said refrigerant fluid; and (f) disconnecting said first thermal head from said refrigeration system.

22. The method as recited in claim 21, further comprising the steps of:

(g) upon completion of step (f), connecting a second thermal head into said fluid flow loop of said refrigeration system;

(h) evacuating air within said second thermal head; and (i) opening said first and second shutoff valves to allow normal flow of said refrigerant fluid to resume.

23. The method as recited in claim 21, wherein steps (c)–(f) are automatically completed in response to actuation of a user input device.

* * * * *